(12) United States Patent
Van Bilsen

(10) Patent No.: US 8,018,594 B2
(45) Date of Patent: Sep. 13, 2011

(54) LITHOGRAPHIC APPARATUS WITH MULTIPLE ALIGNMENT ARRANGEMENTS AND ALIGNMENT MEASURING METHOD

(75) Inventor: Franciscus Bernardus Maria Van Bilsen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/580,564

(22) Filed: Oct. 16, 2009

(65) Prior Publication Data
US 2010/0091297 A1    Apr. 15, 2010

Related U.S. Application Data

(63) Continuation of application No. 11/020,644, filed on Dec. 27, 2004, now Pat. No. 7,626,701.

(51) Int. Cl.
*G01B 11/00* (2006.01)
(52) U.S. Cl. ........................................ 356/401
(58) Field of Classification Search .................. None
See application file for complete search history.

(56) References Cited

U.S. PATENT DOCUMENTS

| | | | |
|---|---|---|---|
| 4,962,318 A | 10/1990 | Nishi | |
| 5,138,176 A | 8/1992 | Nishi | |
| 5,151,750 A | 9/1992 | Magome et al. | |
| 5,521,036 A | 5/1996 | Iwamoto et al. | |
| 5,525,808 A | 6/1996 | Irie et al. | |
| 5,721,605 A | 2/1998 | Mizutani | |
| 5,808,910 A | 9/1998 | Irie et al. | |
| 5,907,405 A | 5/1999 | Mizutani | |
| 5,942,357 A | 8/1999 | Ota | |
| 6,191,429 B1 | 2/2001 | Suwa | |
| 6,278,957 B1 | 8/2001 | Yasuda et al. | |
| 6,525,805 B2 | 2/2003 | Heinle | |
| 6,528,219 B1 * | 3/2003 | Conrad et al. | 430/22 |
| 7,414,722 B2 * | 8/2008 | Van Bilsen | 356/401 |
| 2004/0257572 A1 | 12/2004 | Stacker | |
| 2006/0141374 A1 | 6/2006 | Van Bilsen | |

FOREIGN PATENT DOCUMENTS

| | | |
|---|---|---|
| JP | 5-217835 | 8/1993 |
| JP | 06-034707 | 2/1994 |
| JP | 11-329934 | 11/1999 |
| JP | 11329934 A | 11/1999 |

OTHER PUBLICATIONS

Notice of Reasons for Rejection in related application JP2005-373178 mailed Oct. 26, 2009.
English Translation of Japanese Official Action issued on Dec. 19, 2008 in Japanese Application No. 2005-373178.

(Continued)

*Primary Examiner* — Tarifur R Chowdhury
*Assistant Examiner* — Gordon J Stock, Jr.
(74) *Attorney, Agent, or Firm* — Pillsbury Winthrop Shaw Pittman LLP

(57) ABSTRACT

A lithographic apparatus has a plurality of different alignment arrangements that are used to perform an alignment measurement on the same mark(s) by: detecting a first alignment mark located on an object and producing a first alignment signal by a first detector; detecting the first mark and producing a second alignment signal by a second detector using a different alignment measurement than the first detector; receiving the first alignment signal from the first detector; calculating a first position of the at least first mark based on the first alignment signal; receiving the second alignment signal from the second detector; calculating a further first position of the at least first mark based on the second alignment signal.

9 Claims, 10 Drawing Sheets

OTHER PUBLICATIONS

Nigel R. Farrar et al., "Performance of through-the-lens/off-axis laser alignment systems and alignment algorithms on Nikon wafer steppers", SPIE Integrated Circuit Metrology, vol. 1673, pp. 369-380 (1992) XP002368704.

Kazuya Ota et al., "New Alignment Sensors for Wafer Stepper", SPIE Optical/Laser Microlithography IV, vol. 1463 (1991), pp. 304-314 (1991) XP000988981.

European Search Report issued in EP 05 11 2067 dated Mar. 9, 2006.

* cited by examiner $46 = 44(+1), 42(-1)$
$48 = 44(\ 0\ ), 42(-2)$
$50 = 44(-1), 42(-3)$
$52 = 44(+2), 42(\ 0\ )$
$54 = 44(+3), 42(+1)$

LITHOGRAPHIC APPARATUS WITH MULTIPLE ALIGNMENT ARRANGEMENTS AND ALIGNMENT MEASURING METHOD

CROSS-REFERENCE TO RELATED APPLICATIONS

This application is a continuation of U.S. patent application Ser. No. 11/020,644, filed on Dec. 27, 2004 now U.S. Pat. No. 7,626,701, now allowed, for which priority is claimed under 35 U.S.C. §120, and which, is herein incorporated by reference in its entirety.

BACKGROUND OF THE INVENTION

1. Field of the Invention

The present invention relates to a lithographic apparatus with multiple alignment arrangements and an alignment measurement method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithographic apparatuses are known which use multiple alignment arrangements. Reference is, e.g., made to K. Ota, e.a., New Alignment Sensors for Wafer Stepper, SPIE, Vol. 1463, Optical/Laser Microlithography IV (1991), p. 304-314, and N. R. Farrar, e.a., Performance of through-the-lens/off-axis laser alignment systems and alignment algorithms on Nikon wafer steppers, SPIE Vol. 1673, Integrated Circuit Metrology, Inspection, and Process Control VI (1992), p. 369-380. All of the alignment arrangements use their own, distinct marks on, for example, a substrate to be exposed and/or a substrate table supporting the substrate.

SUMMARY OF THE INVENTION

It is an aspect of the present invention to provide a lithographic apparatus with multiple alignment arrangements.

According to an embodiment of the present invention, a lithographic apparatus includes a first alignment arrangement comprising a first detector configured to detect a first alignment mark located on an object and to produce a first alignment signal; a second alignment arrangement using a different alignment measurement than the first alignment arrangement and comprising a second detector arranged to detect the first mark and to produce a second alignment signal; and a processor connected to the first detector and to the second detector, and configured to receive the first alignment signal from the first detector; calculate a first position of the first mark based on the first alignment signal; receive the second alignment signal from the second detector; and calculate a further first position of the first mark based on the second alignment signal.

According to another embodiment of the present invention, a lithographic apparatus includes a first alignment arrangement comprising a first detector configured to detect a first alignment mark located on an object and to produce a first alignment signal; a second alignment arrangement comprising a second detector configured to detect a second alignment mark on the object and to produce a second alignment signal; a processor connected to the first detector and to the second detector, and configured to receive the first alignment signal from the first detector; calculate a first position of the first mark based on the first alignment signal; receive the second alignment signal from the second detector; calculate a second position of the second mark based on the second alignment signal; combine the first and second positions to calculate a calculated position while using at least one weighting factor on either the first or second position, the weighting factor being determined by an indicator.

According to still another embodiment of the present invention, a lithographic projection apparatus includes a first alignment arrangement comprising a first detector configured to detect a first alignment mark located on an object and to produce a first alignment signal; a second alignment arrangement comprising a second detector configured to detect a second alignment mark on the object and to produce a second alignment signal; a processor connected to the first detector and to the second detector, and configured to receive the first alignment signal from the first detector; calculate a first position of the first mark based on the first alignment signal; receive the second alignment signal from the second detector; calculate a second position of the second mark based on the second alignment signal; combine the first and second positions to calculate a calculated position while using at least one weighting factor on either the first or second position, the weighting factor being determined by an indicator.

According to a still further embodiment of the present invention, an alignment measurement method includes detecting at least a first alignment mark located on an object and producing a first alignment signal by a first detector; detecting the first mark and producing a second alignment signal by a second detector using a different alignment measurement than the first detector; receiving the first alignment signal from the first detector; calculating a first position of the first mark based on the first alignment signal; receiving the second alignment signal from the second detector; and calculating a further first position of the at least first mark based on the second alignment signal.

According to an even further embodiment of the present invention, an alignment measurement method includes detecting a first alignment mark located on an object and producing a first alignment signal by a first detector; detecting a second mark on the object and producing a second alignment signal by a second detector; receiving the first alignment signal from the first detector; calculating a first position of the first mark based on the first alignment signal; receiving the second alignment signal from the second detector; calculating a second position of the second mark based on the second alignment signal; and evaluating the first and second positions to select either a first or a second alignment arrangement to perform further, alignment measurements based on a quality indicator.

According to yet another embodiment of the present invention, an alignment measurement method includes detecting a first alignment mark located on an object and producing a first alignment signal by a first detector; detecting a second mark on the object and producing a second alignment signal by a second detector; receiving the first alignment signal from the first detector; calculating a first position of the first mark based on the first alignment signal; receiving the second alignment signal from the second detector; calculating a second position of the second mark based on the second alignment signal; and combining the first and second positions to calculate a calculated position while using at least one weighting factor on either the first or second position, the weighting factor being determined by an indicator.

The present invention provides computer program products that are executable by a computer or controller to instruct a lithographic apparatus to perform the methods described above. The present invention also provides data carriers containing the computer program products.

BRIEF DESCRIPTION OF THE DRAWINGS

Embodiments of present invention will now be described, by way of example only, with reference to the accompanying schematic drawings in which corresponding reference symbols indicate corresponding parts, and in which.

DETAILED DESCRIPTION

Figure 1:
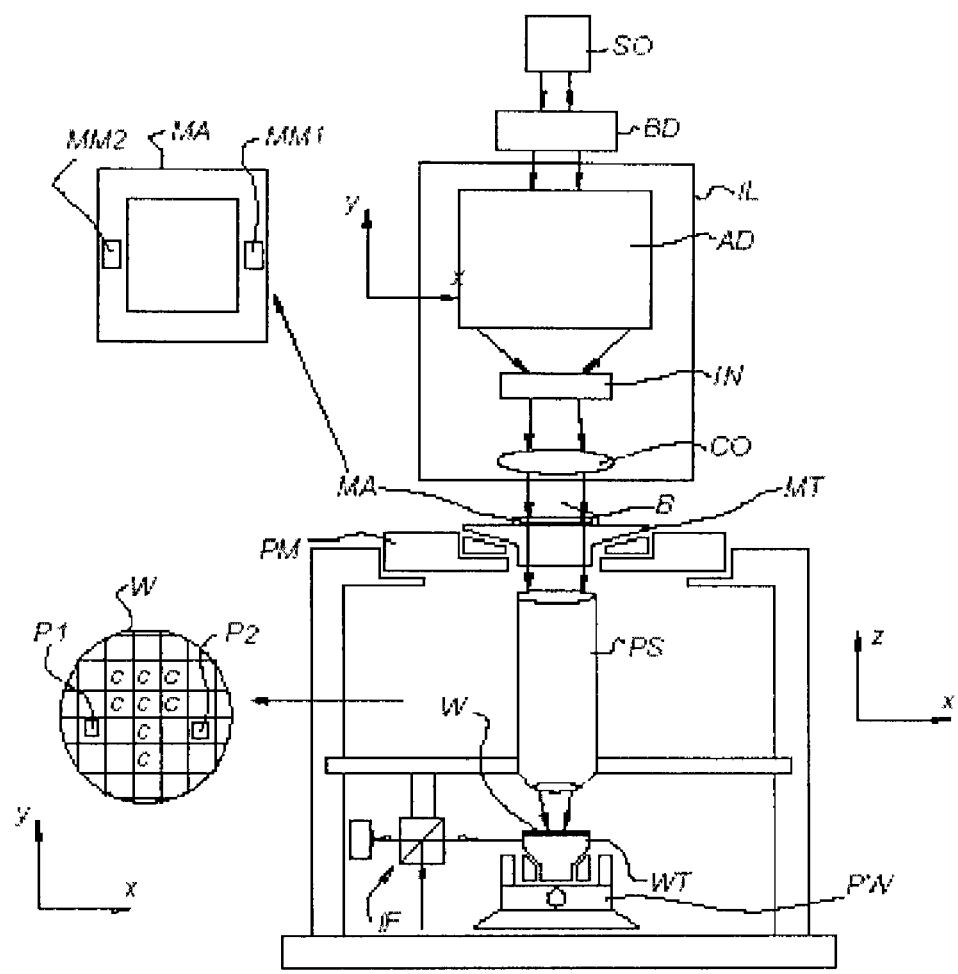
FIG. 1 depicts a lithographic apparatus according to an embodiment of the invention.

FIG. 1 schematically depicts a lithographic apparatus according to one embodiment of the present invention. The apparatus includes an illumination system (illuminator) IL configured to condition a radiation beam B (e.g. UV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam B by patterning device MA onto a target portion. C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g., bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory processes may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of, the lithographic apparatus and the radiation beam is passed from the source SO to the illuminator IL with the aid of a beam delivery system BD including, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which projects the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1 but which may be, e.g., an interferometric device, linear encoder or capacitive sensor) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks MM1, MM2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
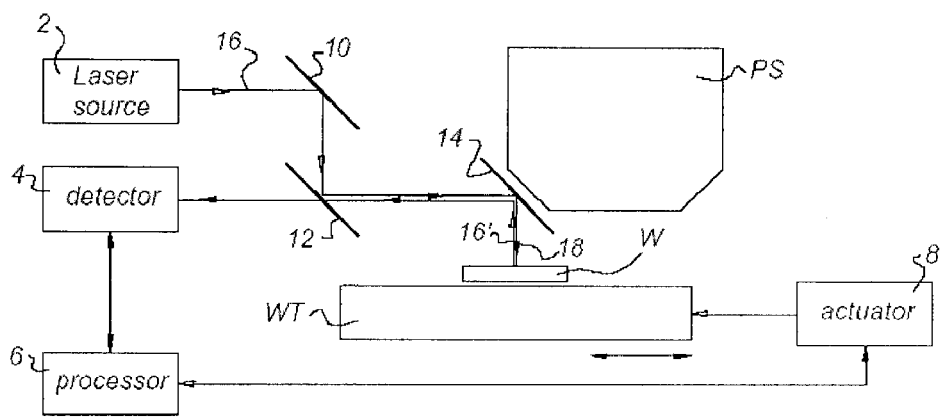
FIG. 2 depicts a schematic diagram of laser step alignment arrangement.

FIG. 2 shows an example of a laser step alignment arrangement. The arrangement shown in FIG. 2 includes a laser source 2, a mirror 10, a semi transparent mirror 12, a mirror 14, a detector 4, and a processor 6. Also shown in FIG. 2 are the projection system PS, the substrate W and the substrate table WT, as well as an actuator 8.

In use, the laser source 2 generates a laser beam 16 that is directed to the mirror 10. The mirror 10 reflects the laser beam 16 to the second mirror 12. The laser beam 16 as reflected by the mirror 12 is directed to the minor 14. The laser beam 16 reflected by the mirror 14 is directed as an alignment beam 18 to a mark M1 (see FIG. 3) on substrate W. The alignment beam 18 as received by the mark M1 is diffracted by the mark M1 as diffracted radiation 16' back to the mirror 14. The mirror 14 reflects the diffracted radiation 16' to the mirror 12. The mirror 12 is semi transparent and passes a portion of the diffracted radiation 16' to the detector 4. The detector 4 receives the portion of the diffracted radiation 16' and generates an output signal for processor 6.

The actuator 8 shown in FIG. 2 is intended to illustrate that the substrate table WT can be moved to such a position that the mark M1 can be aligned with the alignment beam 18. Moreover, the actuator 8 is arranged to move the substrate table WT to allow exposing of the substrate W by exposure light through the projection system PS. The actuator 8 is controlled by processor 6. Of course, in practice, there may be more than one actuator to allow movement of the substrate table WT in a plurality of directions. It is noted that the processor 6 is shown as one single processor unit connected to both the detector 4 and the actuator 8. However, if desired, multiple, different functions of the processor 6 may be implemented in different processors. These processors need not necessarily be within the lithographic apparatus but may be located outside the lithographic apparatus.

Figure 3:
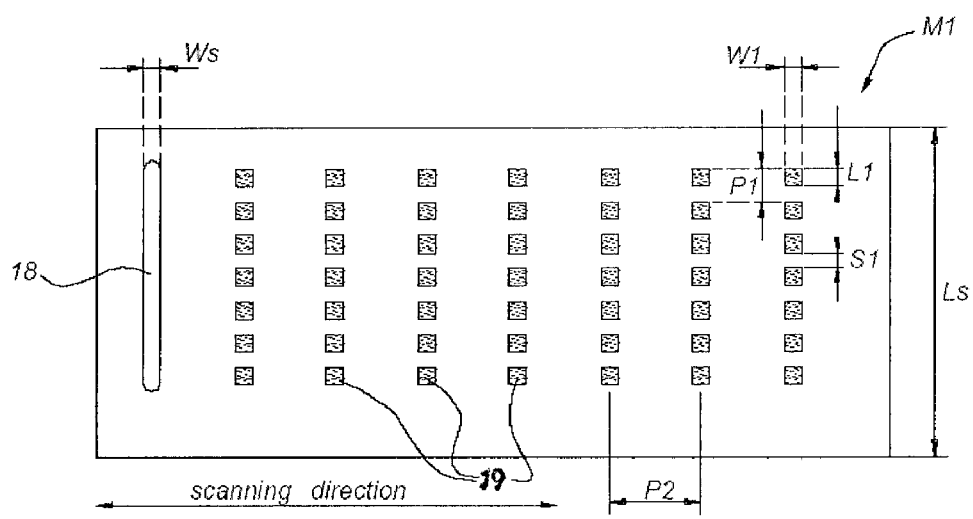
FIG. 3 depicts a mark that can be used in the laser step alignment arrangement of FIG. 2.

FIG. 3 shows an example of a mark M1 that can be located on the substrate W for alignment purposes. However, the mark M1 can also be located on the substrate table WT or any other object to be aligned.

FIG. 3 is a top view of the mark M1. The mark includes a plurality of square shaped structures 19 arranged in rows and columns. The square shaped structures 19 are made of a material or a structure that is distinguishable from its surroundings. The square shaped structures 19 may be portions that are either higher or lower than the surface of the remainder of the mark M1. Instead of square shaped structures 19, other shapes may be used. The square shaped structures 19 have a length L1 and a width W1. Adjacent square shaped structures within a column have a pitch P1 whereas intermediate distances between adjacent square shaped structures within a column are referred to with S1. Adjacent square shaped structures 19 in rows have a pitch P2.

The alignment beam 18 is indicated to produce a substantially rectangular shaped spot with a width Ws and a length Ls. In the embodiment shown, the position of the alignment beam 18 is fixed. The mark M1 can be moved in a direction perpendicular to the columns of the mark M1 in a scanning direction as indicated in FIG. 3. By moving the mark M1 in the scanning direction, the alignment beam 18 can be located above the square shaped structures 19 within one column. Movement is done by actuator 8.

Examples of measures that can be used are:
W1=L1=4 µm;
P1=8 µm;
S1=4 µm;
P2=20 µm
Ws=2 µm
Ls=70 µm However, other figures may be used, as desired.

Figure 4:
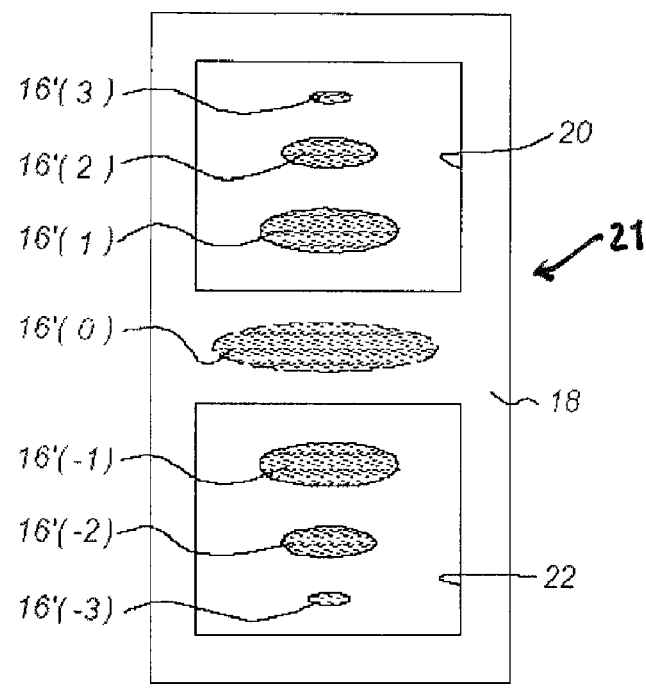
FIG. 4 depicts an example of alignment radiation transmitted by a mark in the alignment arrangement of FIG. 2.

When the alignment beam 18 is directed to one of the columns of square shaped structures 19 as shown in FIG. 3, a diffraction pattern results with a plurality of orders. FIG. 4 shows a cross section through such a diffraction pattern. FIG. 4 shows the following orders of the diffraction pattern of the alignment radiation diffracted by the mark M1: $16'(i)$ ($i=-3, -2, -1, 0, 1, 2, 3$, where i=diffraction order). The diffraction order $16'(0)$ is only shown with dotted lines. The reason is that FIG. 4 also shows a plate 21 with two holes 20, 22. The plate 21 is arranged such that only the orders $16'(i)$, $i=-3, -2, -1, 1, 2, 3$ are able to pass the holes 20, 22. The diffraction order $16'(0)$ is blocked by plate 21. The diffraction orders $16'(i)$, $i=-3, -2, -1, 1, 2, 3$ are directed to the detector 4.

It should be appreciated that the diffraction orders passing through the holes 20 and 22 depend on the size and period of the square shaped structures. The invention is not limited to situations in which diffraction orders $16'(i)$, $i=-3, -2, -1, 1, 2, 3$ are directed to the detector 4. Less or more diffraction orders $16'(i)$ may also be directed to the detector 4.

Figure 5:
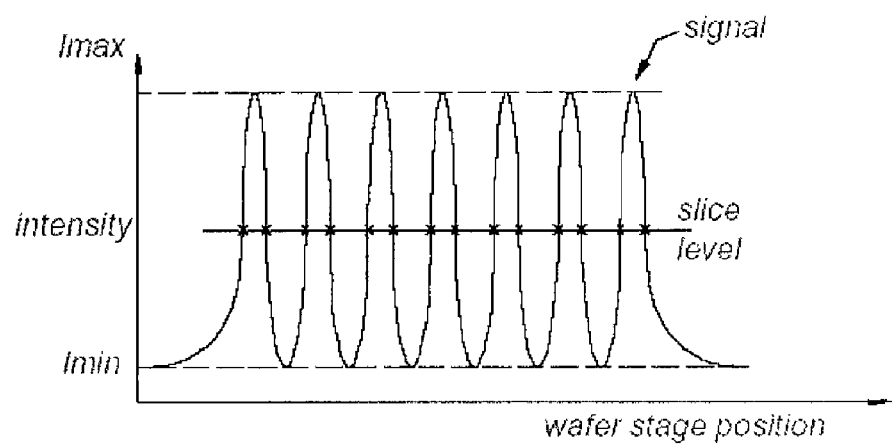
FIG. 5 depicts an output signal of a detector receiving the alignment radiation as shown in FIG. 4.

FIG. 5 shows an output signal of the detector 4 when receiving the diffraction orders $16'(i)$, $i=-3, -2, -1, 1, 2, 3$. The light intensities of the received diffracted orders is integrated by the detector 4. When the holes 20, 22 are passing the diffraction orders $16'(i)$, $i=-3, -2, -1, 1, 2, 3$ as much as possible the output signal of the detector 4 will have a maximum value of Imax. When the substrate table WT is moved in the scanning direction the intensity of the output signal of detector 4 is reduced until a minimum value of Imin when the alignment beam 18 is predominantly illuminating the area between the square shaped structures 19 limiting diffraction intensity. When the substrate table WT moves further in the scanning direction the intensity of the output signal of detector 4 will increase again until the diffraction orders $16'(i)$, $i=-3, -2, -1, 1, 2, 3$ of a next column of square shaped structures 19 is received by the detector 4. This pattern will be repeated until all columns of square shaped structures 19 have been detected by the detector 4. It is observed that the periodic nature of the signal as shown in FIG. 5 has on optimal signal to noise ratio when the zero order $16'(0)$ is blocked by the plate 21.

The signal of FIG. 5 as received by the processor 6 can be used by the processor 6 to align the object on which the mark M1 is located. To that end various known algorithms can be used, for example the positions of the columns of square shaped structures 19 as shown in FIG. 3 as derived from the signal shown in FIG. 5 can be averaged to arrive at a better estimation of the location of mark M1.

Figure 6:
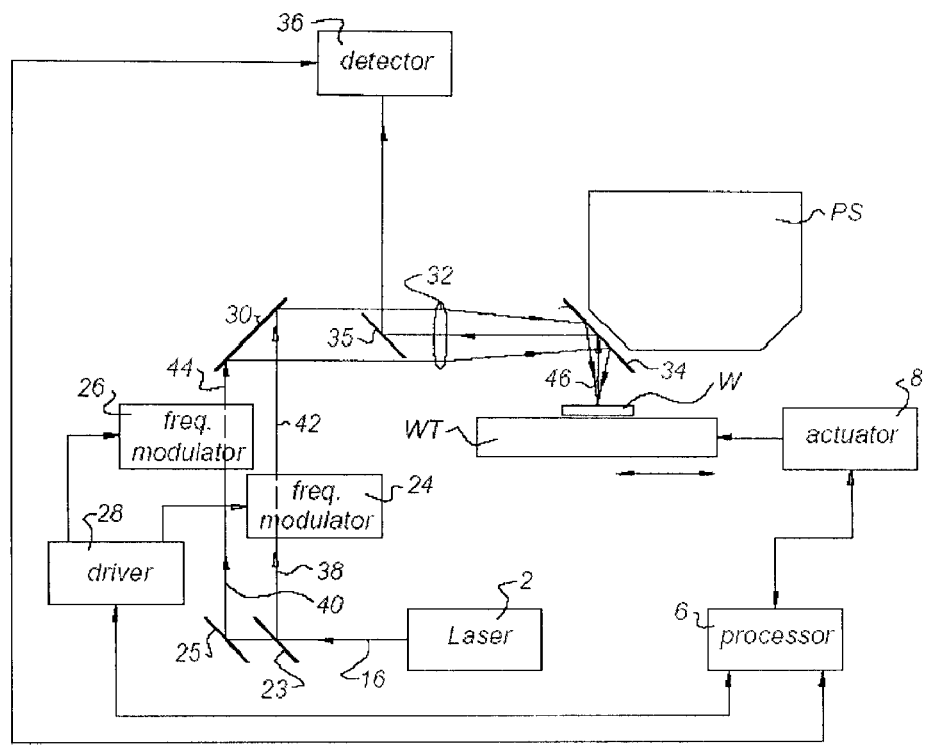
FIG. 6 depicts a schematic example of a laser interferometric alignment arrangement.

FIG. 6 shows a schematic overview of a laser interferometric alignment arrangement. The same reference numbers as in earlier figures refer to the same components.

The alignment arrangement according to FIG. 6 includes a light source 2, e.g., a laser. Moreover, the alignment arrangement of FIG. 6 includes several optical components for forming two alignment beams. The optical components as shown include a semi transparent mirror 23, a mirror 25, and mirrors 30, 34. Moreover, the optical components include two frequency modulators 24, 26, and a lens 32. For receiving alignment radiation back from a mark, the alignment arrangement according to FIG. 6 includes, apart from the mirror 34, a mirror 35 and a detector 36. The frequency modulators 24, 26 are connected to a driver 28. The detector 36 is connected to the processor 6.

In use, the alignment arrangement according to FIG. 6 operates in the following way: The laser 2 produces a light beam 16 that is directed to the mirror 23. A first portion 38 of the light beam 16 is reflected by the mirror 23 to the frequency modulator 24. A second portion 40 of the light beam 16 is passed by the semi-transparent mirror 23 to the mirror 25 and reflected by the mirror 25 to the frequency modulator 26. The frequency modulators 24, 26 are, for example, acousto-optical modulators. As controlled by the driver 28, the frequency modulators 24 and 26, respectively, modulate the light beams 38 and 40, respectively, such that they are both modulated with a relatively high frequency but with a small frequency difference. Typical modulation frequencies are a few tens to a few hundreds MHz, for example about 80 MHz. The difference between the two modulating frequencies may be 25 kHz. Thus, one of the modulating frequencies may be 80,000 kHz and the other one may then be 80,025 kHz. These figures are only presented here as examples. Other figures may be used. The differential frequency may be higher, for example on the order of 100 kHz.

The frequency modulators 24 and 26, respectively, generate light beams 42 and 44, respectively, having a differential frequency as mentioned above. Both light beams 42 and 44 are reflected by mirror 30 towards the lens 32. The lens 32 transmits these light beams 42 and 44 to mirror 34. Mirror 34 reflects the light beams 42 and 44 to a mark M2 (see FIG. 7) on substrate W. The mark M2 diffracts the received light beams 42 and 44 and forms diffraction orders transmitted back to the mirror 34. One of those orders is shown with reference number 46 in FIG. 6. The diffraction order 46 is reflected by mirror 34 towards the mirror 35 through the lens 32 and will be received by detector 36. The detector 36 generates a suitable output signal depending on the received diffraction order 46.

Figure 7:
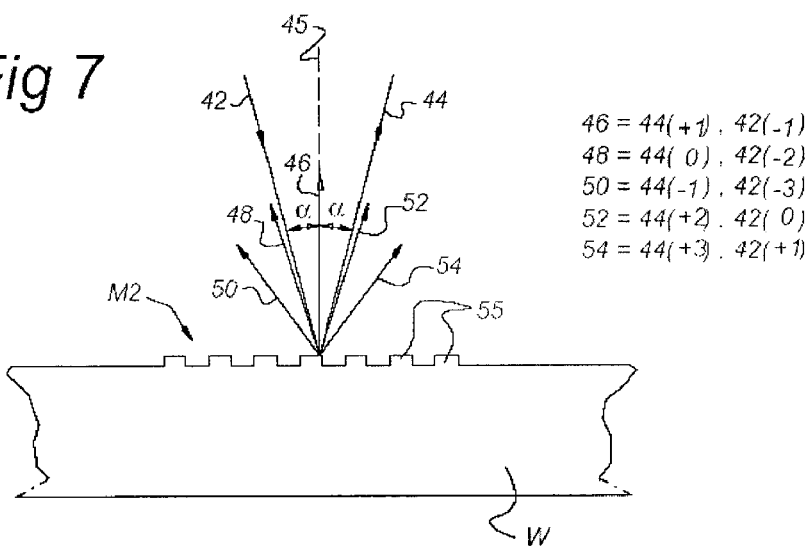
FIG. 7 depicts an example of how alignment beams are directed to and diffracted by a mark on a substrate in the arrangement according to FIG. 6.

FIG. 7 shows a mark M2 on substrate W. The mark M2 includes a plurality, for example seven, bar-shaped structures 55 extending from the surface of substrate W. A perpendicular to the substrate W, and to the mark. M2, is shown with reference number 45. Alignment beams 42 and 44 are impinging on the mark M2. The optical components as referred to above are designed such that the alignment beams 42 and 44 are both impinging on the mark M2 under an angle $\alpha$. Both the alignment beam 42 and alignment beam 44 are diffracted by the mark M2. The alignment beams 42 and 44, thus, produce several alignment orders. The angle $\alpha$ is chosen such that the first order diffraction of light beam 42 leaves the mark M2 again under an angle $\alpha$ with the perpendicular 45, i.e., propagates away from the mark M2 along the path along which also alignment beam 44 is propagating, but in an opposite direction. This zero diffraction order is indicated with 42(0). Moreover, a −1 diffraction order 42(−1) is produced that propagates along the perpendicular 45 away from the mark M2. A −2 diffraction order 42(−2) propagates away from the mark M2 along the path along which alignment beam 42 is propagating, but in an opposite way. At the same time a zero diffraction order 44(0) due to incoming alignment beam 44 is directed away from the mark M2 along the path along which the alignment beam 42 is propagating, but in an opposite direction. Thus, a beam 48 is propagating away from the mark M2 that is a combination of the zero diffraction order 44(0) due to incoming alignment beam 44 and −2 diffraction order 42(−2) due to incoming alignment beam 42. Other beams, that are combinations of diffraction orders due to the incoming alignment beams 42 and 44 are indicated in FIG. 7 with reference numbers 46, 50, 52, and 54. Their content originates from:

beam 46=44(1) and 42(−1)
beam 50=44(−1) and 42(−3)
beam 52=44(2) and 42(0)
beam 54=44(3) and 42(1)

The arrangement of FIG. 6 is such that the beam 46 is directed to detector 36 via mirrors 34 and 35, and lens 32. When the mark M2 is displaced by the actuator 8, a phase difference will result between the diffraction orders 44(1) and 42(−1). Due to the modulated frequencies and the frequency difference between the alignment beams 42 and 44, the detector 36 will detect a beat signal. A reference beam measuring a reference mark with known position (not shown) is used to determine an aligned position of the mark M2. For further details, the reader is referred to the article by Ota in SPIE vol. 1463, referred to above.

Figure 8:
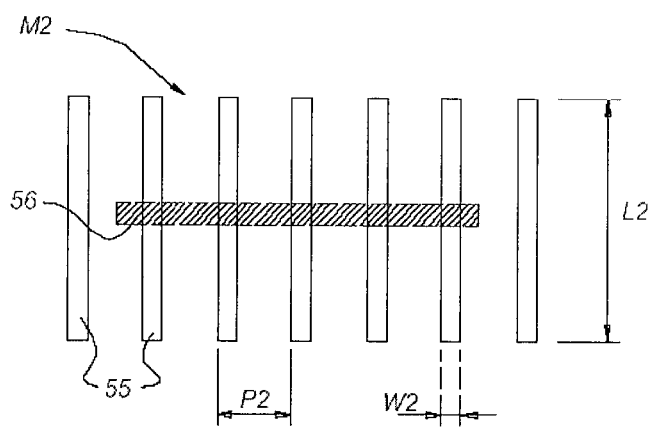
FIG. 8 depicts a top view of a mark that can be used in the arrangement according to FIG. 6.

FIG. 8 shows a top view of the mark M2 with its bar-shaped structures 55. The bar-shaped structures 55 have a width W2 and a length L2. Values for these dimensions, for example, are: W2=4 μm, L2=70 μm. The bar-shaped structures 55 have a pitch P2. A typical value for the pitch P2=8 μm. The alignment beams 42 and 44, preferably, have a rectangularly shaped cross section as indicated with reference number 56 in FIG. 8.

Figure 9:
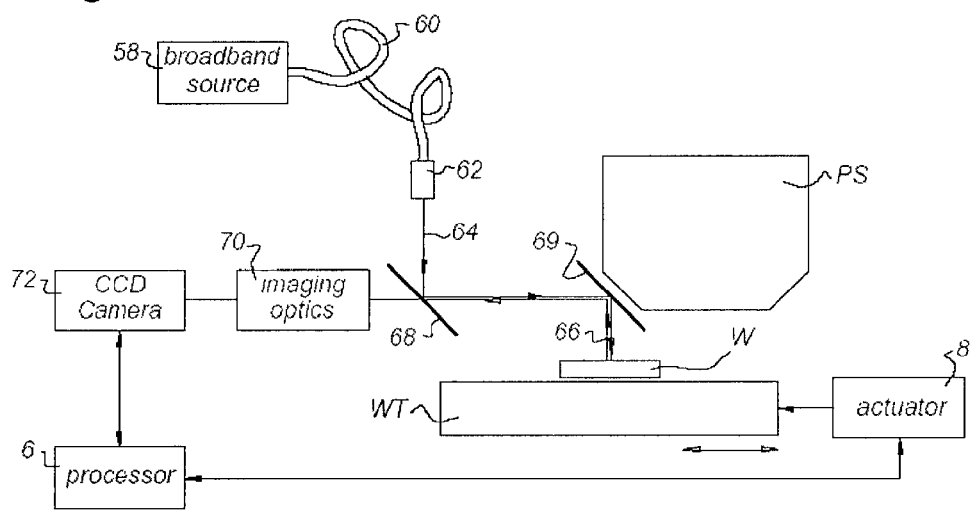
FIG. 9 depicts a schematic example of a field image alignment arrangement.

The alignment system of FIG. 2 is based on a dynamic measurements, i.e., are based on movements of the mark relative to the alignment beam or alignment beams. The alignment systems of FIG. 6 and FIG. 9 show alignment arrangements based on a static measurement. The alignment arrangements shown in FIG. 9 includes a light source 58, which may be a broad band source. The light source 58 is connected to a fiber 60 at one end of the fiber 60. A transmitter 62 is connected to the opposite end of the fiber 60. Optics to provide an alignment beam towards a mark M3 (see FIG. 10) include a semi-transparent mirror 68 and a mirror 69. Imaging optics 70 are provided to receive alignment radiation back from the mark M3 and to provide an output signal to a detector 72, for example a CCD camera. The detector 72 is connected to the processor 6.

In use, the light source 58 produces a broadband light beam that is output via the fiber 60 to the transmitter 62. The transmitter 62 provides a broadband light beam 64 that is reflected by mirror 68 to mirror 69. Mirror 69 produces a broadband alignment beam 66 to be directed to mark M3 on substrate W. The broadband light beam impinging on the mark M3 is reflected back as alignment radiation to the mirror 69. The mirror 69 reflects the received light to the semi-transparent mirror 68 which passes at least a portion of the received light to the imaging optics 70. The imaging optics 70 are arranged to collect the received alignment radiation and to provide a suitable optical image to the detector 72. The detector 72 provides an output signal to the processor that depends on the content of the optical image received from the imaging optics 70.

Figure 10:
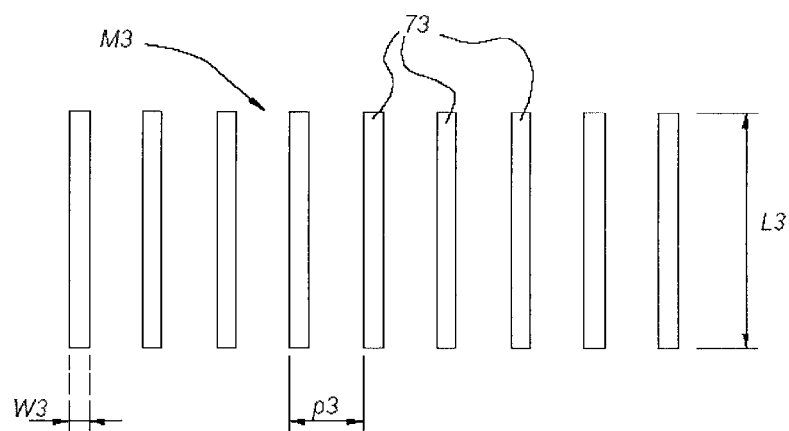
FIG. 10 depicts an example of a mark that can be used in the alignment arrangement of FIG. 9.

The mark M3 present on substrate W that may be used is shown in FIG. 10. It is similarly shaped as the mark M2 shown in FIG. 8. It includes a plurality of bar-shaped structures 73 that have a width W3 and a length L3. Values for these dimensions, for example, are W3=6 μm, L3=75 μm. The bar-shaped structures 73 have a pitch P3. A value for the pitch may be P3=12 μm.

Figure 11:
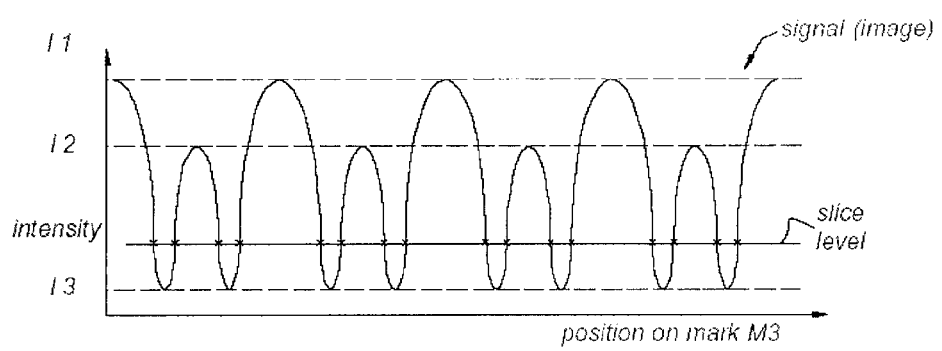
FIG. 11 depicts an output signal of a detector used in the arrangement of FIG. 9 and receiving alignment radiation back from a mark.

FIG. 11 shows an output signal of the detector 72 that is transmitted to the processor 6 based on the optical image of the mark M3, as received from the imaging optics 70. The curve shown in FIG. 11 shows intensity of the signal as a function of position on mark M3. The curve shows absolute maxima at an intensity level of I1, local maxima with an intensity level of I2 and absolute minima with an intensity level of I3. The absolute maximum I1 are associated with the centers of the respective bar-shaped structures 73. The local maxima 12 are associated with the centers of the spaces between adjacent bar-shaped structures 73. The absolute minima I3 are associated with locations just beside transitions of the bar-shaped structures 73 towards the intermediate spaces between the bar-shaped structures. So, the slopes of the curve between absolute maxima I1 and absolute minima I3 are due to the transitions between the bar-shaped structures 73 and the intermediate spaces between the bar-shaped structures 73. At these transitions, i.e., side faces of the bar-shaped structures, only little light is reflected.

Thus, the detector 72 receives a 2-D image of the mark M3 whereas the output signal of the detector 72 to the processor includes 1-D information. Various algorithms can be used to arrive at an intensity signal as shown in FIG. 11 from the received image information. For example, the detector 72 may be a CCD camera with CCD elements arranged in columns and rows, where the signals received by the CCD elements in a column are averaged. For further details, the reader is referred to the article by Ota in SPIE Vol. 1463, referred to above.

In the alignment arrangements as shown in FIGS. 2, 6, and 9 separate, different marks M1, M2, and M3 are used. In these prior art arrangements, if one wants to use one of these alignment arrangements, one chooses one of the different marks M1, M2, M3 and provides the chosen mark on the object (e.g., a substrate or a substrate table) beforehand. If one wishes to use a plurality of the three alignment arrangements according to FIGS. 2, 6, and 9, one provides multiple, different alignment marks M1, M2, and M3 on the object to the aligned. If one uses multiple, different alignment marks M1, M2, and M3 on the object one can switch from one alignment arrangement to another alignment arrangement quite easily. When alignment marks M1, M2, and M3 are used on a substrate W, these are commonly located in the scribelanes of the substrate W. Especially when one wishes to use multiple, different alignment marks M1, M2, and M3 this is a desirable as currently many other devices/circuits are located in the space occupied by the scribelanes. Availability of enough space in the scribelanes is an increasingly important issue.

In an embodiment of the present invention, alignment marks are presented that are suitable for use by multiple different alignment arrangements using different ways of alignment measurements, for example as described above. Providing such alignment marks that are suitable for multiple different alignment arrangements increases flexibility during production of substrates W.

Figure 12:
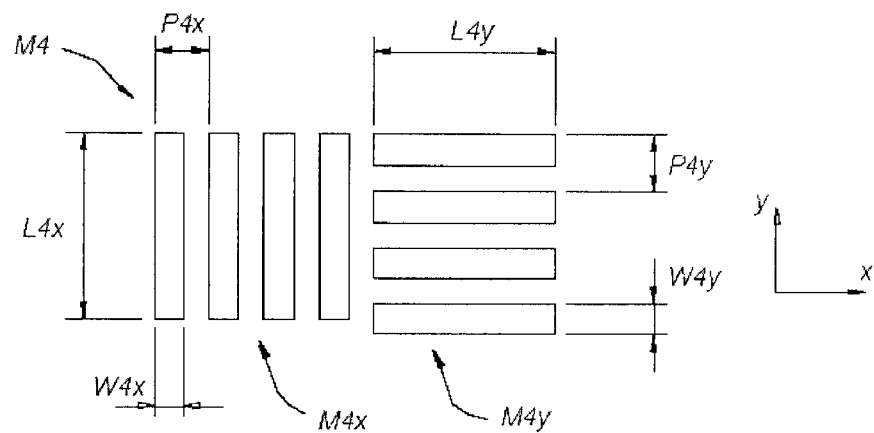
FIGS. 12 and 13 depict examples of marks that can advantageously be used in an arrangement according to the present invention.

Referring to FIG. 12, an alignment mark M4 has a first portion M4$x$ for measuring a position in an x-direction and a second portion M4$y$ for measuring a position in an y-direction. The first mark portion M4$x$ is similar to the marks M2 and M3. It includes a plurality of bar-shaped structures with a width W4$x$, a length L4$x$, and a pitch P4$x$. The second mark portion M4$y$ is similar to the mark M4$x$, but rotated by 90°. The mark portion M4$y$ includes bar-shaped structures with a width W4$y$, a length L4$y$, and a pitch P4$y$. The widths M4$x$, W4$y$, the lengths L4$x$, L4$y$, and the pitches P4$x$, P4$y$, respectively, have similar values as the widths W2, W3, the lengths L2, L3, and the pitches P2, P3, respectively, of the marks M2 and M3. The mark M4 may be used by both a laser interferometric alignment arrangement as shown in FIG. 6, and a field image alignment arrangement as shown in FIG. 9. Moreover, note that an alignment beam for locating a position in an x-direction should be directed to the mark portion M4$x$, whereas an alignment beam for measuring a position in an y-direction should be directed to the mark portion M4$y$. The mark portions M4$x$ and M4$y$ are located near one another as close as possible.

When one wishes to measure a position in one direction only, it is sufficient to provide only mark portion M4$x$ or mark portion M4$y$. With at least one of the mark portions M4$x$, M4$y$ one can use both alignment arrangements as shown in FIGS. 6 and 9. Using only one mark for multiple, different alignment arrangements, saves scribelane space and provides a user with the freedom to change an alignment arrangement during production of a substrate. In case both alignment arrangements are applicable it is possible to use both signals for accuracy improvement. Moreover, when different alignment arrangements use the same alignment mark, it can be assured that those different alignment arrangements have identical coordinate systems. When such an alignment mark M4 is provided on the substrate table WT, the alignment mark M4 can also be used for on-line calibration purposes.

Figure 13:
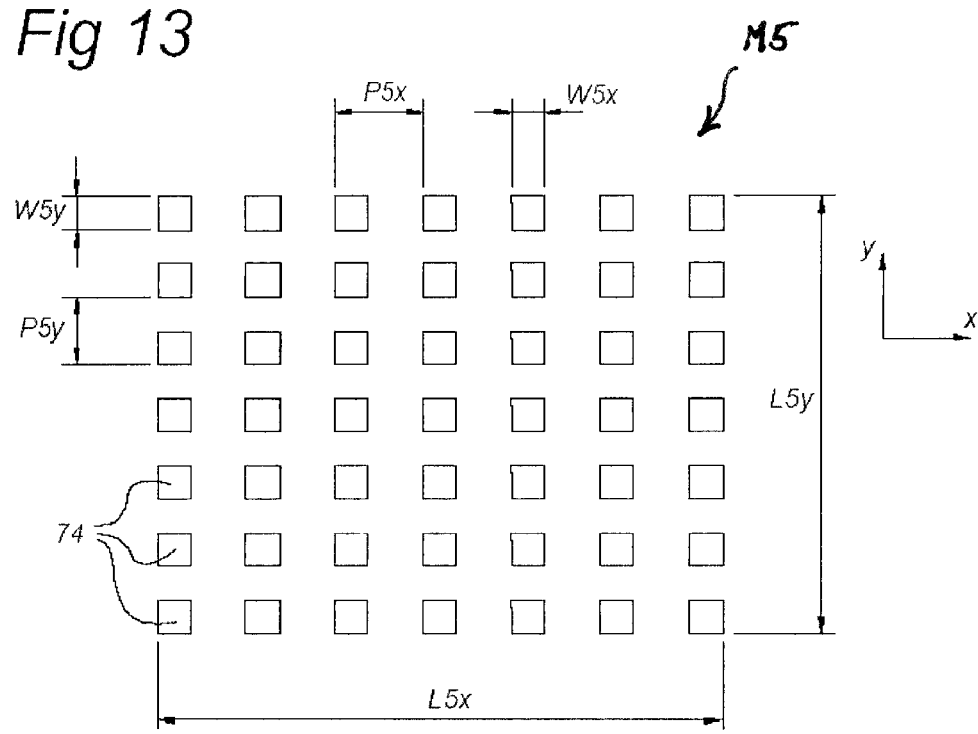

FIG. 13 shows an other example of an alignment mark M5 that can be used for multiple alignment arrangements. The alignment mark M5 is similar or equal to the alignment mark M1 as shown in FIG. 3. The alignment mark M5 has a plurality of columns. In each column a plurality of square shaped structures 74 is located. The square shaped structures 74 have a width W5$x$ in the x-direction and a width W5$y$ in the y-direction. The length of the mark M5 in the x-direction is L5$x$ and the length of the mark M5 in the y-direction is L5$y$. The mark. M5 has a pitch P5$x$ between adjacent columns in the x-direction and a pitch P5$y$ between the rows in the y-direction. Values of the widths W5$x$, W5$y$ are, for example, 4 μm. Values for the lengths L5$x$, L5$y$ are, for example: 40-100 μm. Values for pitches P5$x$, P5$y$ are, for example, 8 μm.

The mark M5 as shown in FIG. 13 can be used as an alignment mark in all three alignment arrangements as explained with reference to FIGS. 2-11. Use of the alignment mark M5 in the alignment arrangement shown in FIG. 2 is as described above.

However, when the cross section 56 of the alignment beams 42 and 44 of the alignment arrangement shown in FIGS. 6 and 8 has a width that is smaller than the widths W5$x$, W5$y$, then, the alignment mark M5, as shown in FIG. 13, can also be used in the alignment arrangement according to FIG. 6, both for a measurement in the x-direction and in the y-direction. Since the width of the cross section 56 of the alignment beams 42 and 44 may be in the order of 2 μm this is a very feasible option.

The mark M5 can also be used in the arrangement shown in FIG. 9. When used in the arrangement according to FIG. 9, an intensity signal similar to the one shown in FIG. 11 will be produced by detector 72 for processor 6. The mark M5 maybe less desirable than the mark M3 or M4 for the alignment arrangement according to FIG. 9 due to a poorer signal/noise ratio. However, due to using broadband light source 58 this is anticipated not to be a large problem since using a broadband light source 58 results in constructive interference at some portion of the used bandwidth.

Thus, the alignment mark M5 has similar features as mark M4 of FIG. 12. Moreover, note that the alignment mark M5 can, in principle, also be used in both the x-direction and the y-direction.

Figure 14:
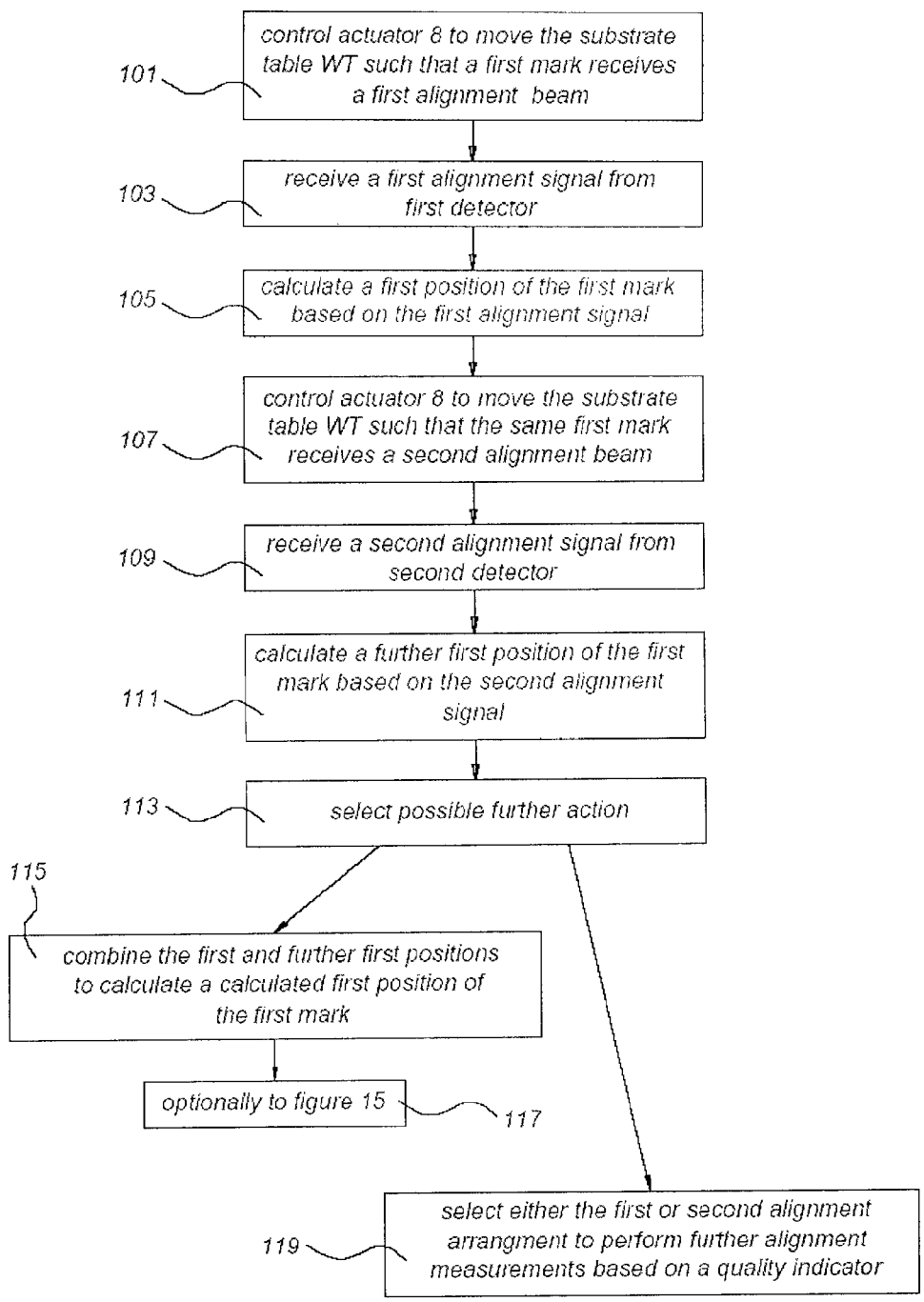
FIGS. 14, 15, and 16 depict flow charts of measurement methods in accordance with the present invention.
Figure 15:
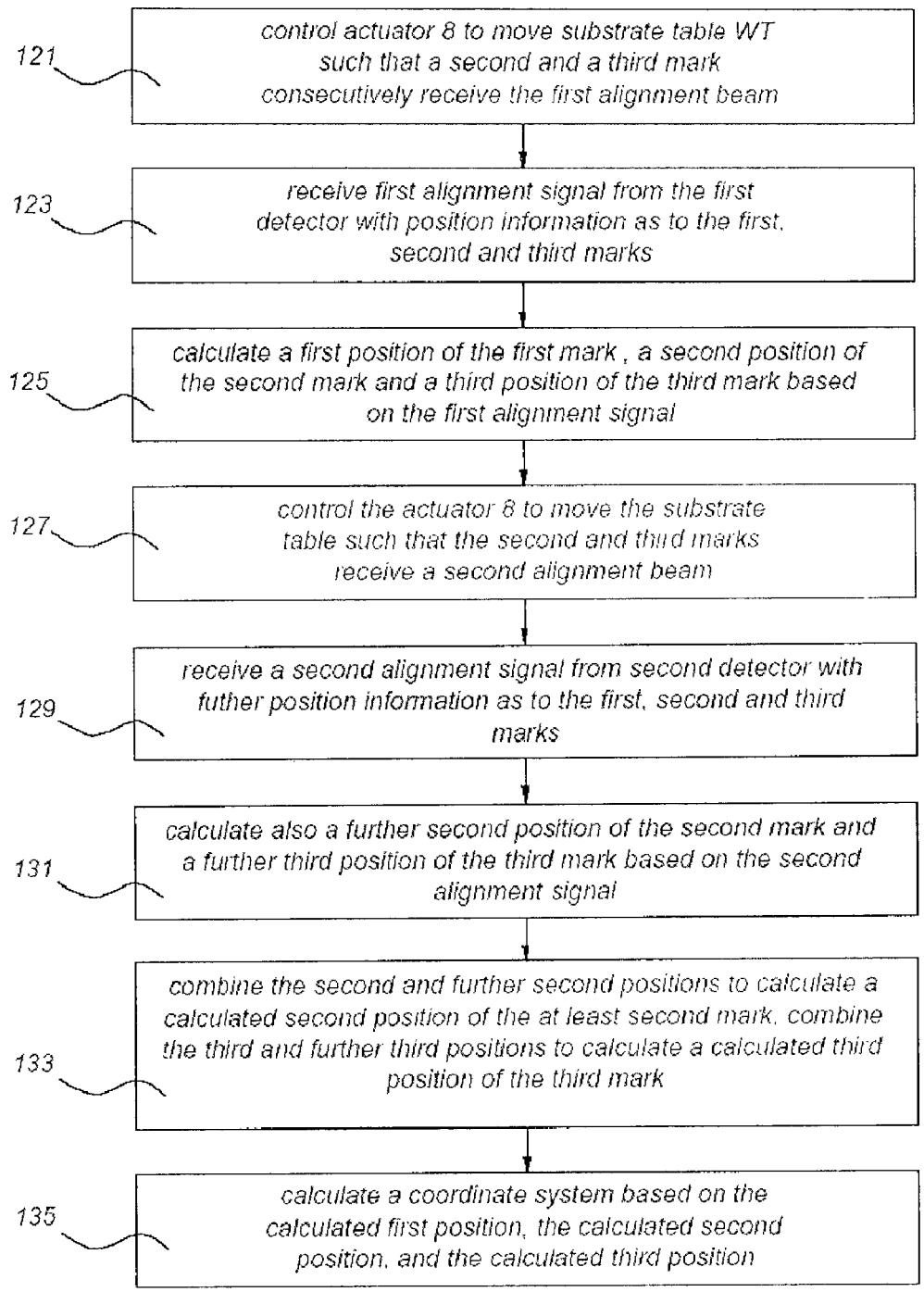

FIGS. 14 and 15 show flow charts related to the functionality of the processor in the embodiments described above.

The processor controls the actuator to move the substrate table WT such that a first mark receives a first alignment beam. The first mark is one of the alignment marks suitable to be used with two or more different alignment arrangements. The first alignment beam is produced by a first alignment arrangement. This is done in action 101.

In action 103, the processor receives a first alignment signal from a first detector in the first alignment arrangement. This first alignment signal relates to the alignment radiation received from the first mark by the first detector in the first alignment arrangement.

In action 105, the processor calculates a first position of the first mark based on the first alignment signal as received from the first detector.

In action 107, the processor controls the actuator to move the substrate table WT such that the same first mark receives a second alignment beam. The second alignment, beam is produced by a second alignment arrangement which differs from the first alignment arrangement.

In action 109, the processor receives a second alignment signal from a second detector present in the second alignment arrangement.

In action 111, the processor calculates a further first position of the first mark based on the second alignment signal.

Using the actions 101-111 provides that the same mark is used by different alignment arrangements where the different alignment arrangements use different ways of alignment measurement. By using the same alignment mark, for example in scribelanes on the substrate W, space may be saved.

Action 113 shows a further option to be performed by the processor, i.e., selecting a possible further action. In FIG. 14 two possible further actions are shown. The first further action that can be performed by the processor is shown in action 115, where the first and, further first positions are combined by the processor to calculate a calculated first position of the first mark. This combination of the first and further first positions can be done in various ways. One way would be to average the first and further first positions. By doing so, the calculated first position will have a more accurate value. After action 115, the processor may perform other optional actions illustrated in FIG. 17, as indicated with reference number 117 in FIG. 14.

Instead of action 115, the processor may perform action 119 after action 113, in which processor selects either the first or second alignment arrangement to perform further alignment measurements based on a predetermined quality indicator. Such a predetermined quality indicator may be at least one of signal strength, noise level, and fit quality of the first and second alignment signals.

FIG. 15 shows a flow chart of the actions that may be performed by processor in action 117 (see FIG. 14).

In action 121, the processor controls the actuator to move the substrate table WT such that a second and a third mark consecutively receive the first alignment beam as produced by the first alignment arrangement.

In action 123, the processor receives the first alignment signal from the first detector with position information as to the first, second, and third marks. Accordingly, in action 123, at least three marks are measured with the first alignment arrangement.

In action 125, the processor calculates a first position of the first mark, a second position of the second mark and a third position of the third mark based on the first alignment signal.

In action 127, the processor controls the actuator to move the substrate table WT such that the second and third marks receive a second alignment beam from a second alignment arrangement.

In action 129, the processor receives a second alignment signal from the second detector in the second alignment arrangement with further position information as to the first, second, and third marks.

In action 131, the processor calculates, apart from the further first position of the first mark as already calculated in action 111, also a further second position of the second mark and a further third position of the third mark based on the second alignment signal.

In action 133, the processor combines the second and further second positions to calculate a calculated second position of the at least second mark, and combines the third and further third positions to calculate a calculated third position of the third mark. Various algorithms can be used here, e.g. averaging.

In action 135, the processor calculates a coordinate system based on the calculated first position, the calculated second position and the calculated third position. Such a coordinate system will be more reliable than a coordinate system based on alignment measurements on the three marks by one single alignment arrangement only. By measuring on the three alignment marks with two or more alignment arrangements based on different measurement methods, and, e.g., averaging the results, the alignment results can be improved.

Figure 16:
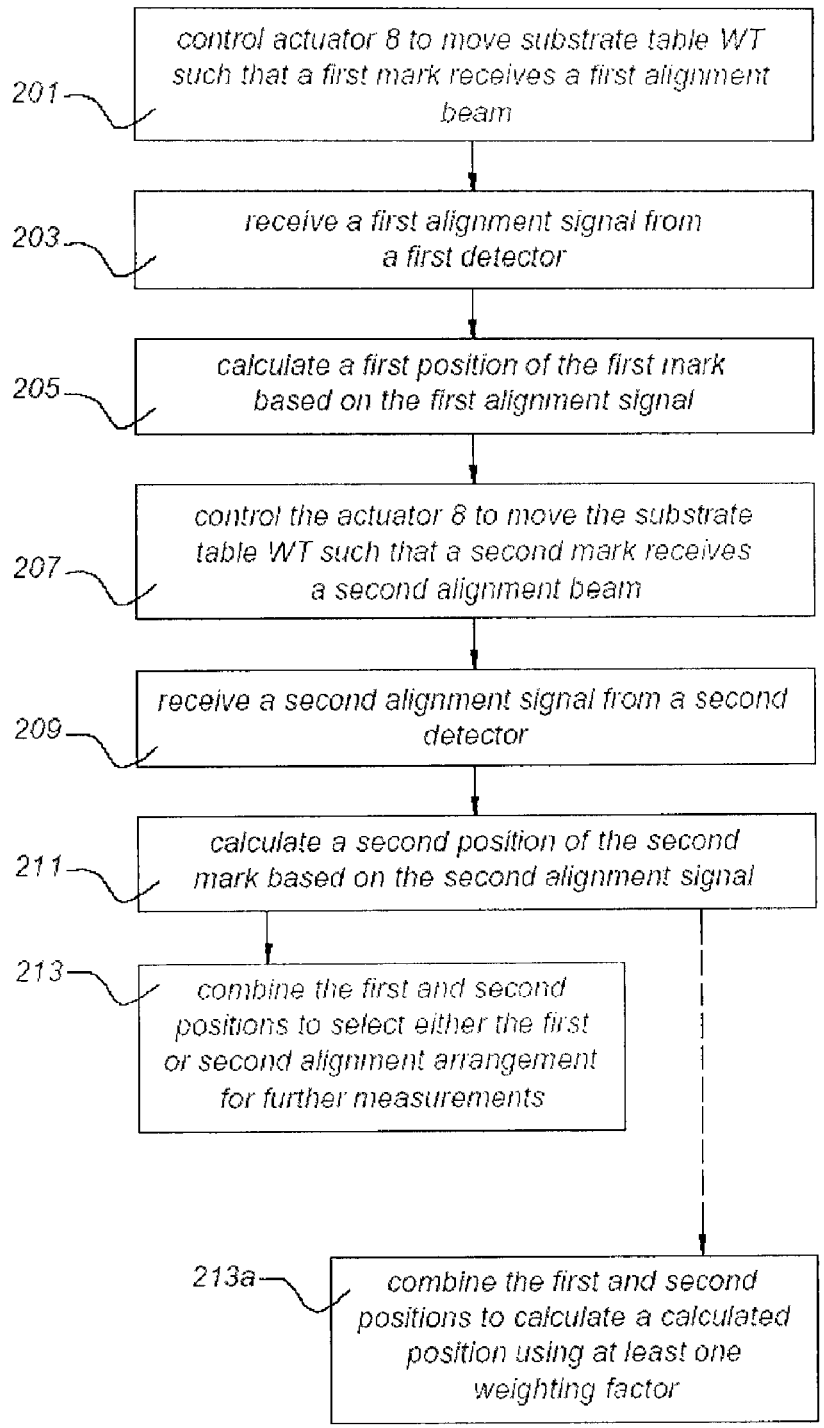

FIG. 16 shows a flow chart of a program running on the processor. In action 201, the processor controls the actuator to move the substrate table WT such that a first mark receives a first alignment beam of a first alignment arrangement.

In action 203, the processor receives a first alignment signal from a first detector in the first alignment arrangement.

In action 205, the processor calculates a first position of the first mark based on the received first alignment signal.

In action 207, the processor controls the actuator to move the substrate table WT such that a second mark receives a second alignment beam from a second alignment arrangement.

In action 209, the processor receives a second alignment signal from a second detector in the second alignment arrangement.

In action 211, the processor calculates a second position of the second mark based on the second alignment signal.

In this program, the first alignment arrangement differs from the second alignment arrangement in its alignment measurement method performed. For example, the first alignment arrangement can be anyone of the alignment arrangements explained with reference to FIGS. 2-11, whereas the second alignment arrangement is then also one of these alignment arrangements but different from the first alignment arrangement. Here, each of the alignment arrangements used performs an alignment measurement on a mark that is dedicated to the alignment arrangement concerned, as explained above.

In action 213, the processor combines the first and second positions to select either the first or second alignment arrangement to perform further alignment measurements based on a quality indicator. Such a quality indicator may be one or more from the following group of quality indicators: signal strength, noise level, and fit quality of the first and second alignment signals. Such quality indicators are ways to derive these quality indicators from alignment measurements made by the different alignment arrangements described above.

In another embodiment, the processor combines the first and seconds positions to calculate a calculated position using at least one weighting factor on either the first or second position. This is shown in FIG. 16 as an alternative action 213a to action 213. The weighting factors are used as multiplication factors for the first and second positions in such a calculation. Again, such an indicator may be one or more from the following group of quality indicators: signal strength, noise level, and fit quality of the first and second alignment signals. The weighting factors may be determined by such indicators in the following way.

The calculated position (P) is calculated based on a first measurement ($P_1$) multiplied with a first weighting factor ($w_1$) and a second measurement ($P_2$) multiplied with a second weighting factor ($w_2$)

$$P = w_1 * P_1 + w_2 * P_2$$

The weighting factors $w_1$ and $w_2$ can be determined by the following formula in which the quality indicator of the first measurement is identified with $I_1$ and $I_2$ represents the quality indicator of the second measurement.

$$w_1 = \frac{I_1}{I_1 + I_2}$$
$$w_2 = \frac{I_2}{I_1 + I_2}$$

In another embodiment the processor selects the optimum measurement based on the values of the quality indicator:

$w_1 = 1; w_2 = 0$ if $I_1 \geq I_2$ $w_1 = 0; w_2 = 1$ if $I_1 < I_2$

In yet an other embodiment, the processor weights both measurements in case the indicators have a similar value and selects a single measurement in case the indicators clearly favor a single measurement. This can be represented with the following formula:

$$W_1 = \frac{(S+1)\cdot\left(\frac{I_1}{I_1+I_2}\right)-1}{S-1}$$

$$W_2 = \frac{(S+1)\cdot\left(\frac{I_2}{I_1+I_2}\right)-1}{S-1}$$

$W_1 = 0$ if $W_1 < 0$ $W_1 = 1$ if $W_1 > 1$ $W_2 = 0$ if $W_2 < 0$ $W_2 = 1$ if $W_2 > 0$ where S is a factor with a predetermined value ranging from 1.1 to 99.9 with a value of, for example, 10.

Both embodiments will improve performance and/or robustness.

The embodiments explained above, may provide, upon specific implementation, the following:
1. improved alignment accuracy;
2. improved alignment robustness;
3. reduced scribelane usage.

The calculated position (P) is calculated based on a first measurement ($P_1$) multiplied with a first weighting factor ($w_1$) and a second measurement ($P_2$) multiplied with a second weighting factor ($w_2$)

$$P = w_1 * P_1 + w_2 * P_2$$

The weighting factors $w_1$ and $w_2$ can be determined by the following formula in which the quality indicator of the first measurement is identified with $I_1$ and $I_2$ represents the quality indicator of the second measurement.

$$w_1 = \frac{I_1}{I_1+I_2}$$

$$w_2 = \frac{I_2}{I_1+I_2}$$

In another embodiment the processor selects the optimum measurement based on the values of the quality indicator:

$w_1=1$; $w_2=0$ if $I_1 \geq I_2$
$w_1=0$; $w_2=1$ if $I_1 < I_2$

In yet an other embodiment, the processor weights both measurements in case the indicators have a similar value and selects a single measurement in case the indicators clearly favor a single measurement. This can be represented with the following formula:

$$W_1 = \frac{(S+1)\cdot\left(\frac{I_1}{I_1+I_2}\right)-1}{S-1}$$

$$W_2 = \frac{(S+1)\cdot\left(\frac{I_2}{I_1+I_2}\right)-1}{S-1}$$

$W_1 = 0$ if $W_1 < 0$ $W_1 = 1$ if $W_1 > 1$ $W_2 = 0$ if $W_2 < 0$ $W_2 = 1$ if $W_2 > 0$ where S is a factor with a predetermined value ranging from 1.1 to 99.9 with a value of, for example, 10.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the present invention may be used in other applications, for example imprint lithography or immersion lithography, and where the context allows, is not limited to optical lithography. In imprint lithography a topography in a patterning device defines the pattern created on a substrate. The topography of the patterning device may be pressed into a layer of resist, supplied to the substrate whereupon the resist is cured by applying electromagnetic radiation, heat, pressure or a combination thereof. The patterning device is moved out of the resist leaving a pattern in it after the resist is cured.

Although specific reference may have been made above to the use of embodiments of the invention in the context of top side alignment, it should be appreciated that the invention may be used in applications where the alignment marks are located at the bottom side of the wafer.

Although specific reference may have been made above to the use of embodiments with specific alignment mark dimensions, it should be appreciated that mark dimension adjustments which reduce the sensitivity of the alignment mark to certain processes, like CMP (chemical mechanical polishing), PVD (physical vapor deposition), or etching may be made without departing the scope of the present invention.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above and executable to cause a computer, for example a programmed general purpose computer, or a controller, for example an ASIC, to perform the methods as disclosed above, or embodied in a data storage medium (e.g. semiconductor memory, magnetic or optical disk) having such a computer program stored therein.

In an alternative embodiment, one or more of the alignment arrangements differ from the alignment arrangements explained with reference to FIGS. 2-11. For example, the present invention is also applicable with other types of alignment setups, for example with an "Athena" sensor. This alignment sensor measures a position of an alignment mark. Here, during alignment the alignment mark is illuminated with an alignment beam of radiation. The alignment beam of radiation is diffracted by the alignment mark into several diffraction orders such as +1, −1, +2 and −2. Using optical elements, each set of corresponding diffraction orders, for example +1 and −1, is used to form an image of the alignment mark onto a reference plate. The reference plate includes reference gratings for each set of corresponding diffraction orders to be measured. Behind each reference grating a separate detector is arranged to measure the intensity of the radiation in the image passing through the reference gratings. By moving the alignment mark relative to the reference plate, the position with the highest intensity for one or more images is determined, which gives the aligned position. To enhance performance, the intensity of several images can be measured and the alignment beam of radiation can consist of multiple colors.

Use of other types of sensors is not excluded, like sensors based on capacitive or acoustic measurements.

Moreover, although the arrangement as shown with reference to FIG. 2 shows that actuator 8 moves substrate table WT so as to create a movement of alignment beam 18 across substrate W, it should be understood that alignment beam 18 may be moved by suitable devices, for example by a mirror actuated to sweep alignment beam 18 across substrate W, whereas, then, the substrate table WT and thus substrate W would remain on a fixed location. In a still further embodiment, both the substrate table and the alignment beam may be moving while performing the measurement.

The descriptions above are intended to be illustrative, not limiting. Thus, it should be appreciated that modifications may be made to the invention as described without departing from the scope of the claims set out below. For example, the figures may show physical connections to transport signals from one device to an other. However, all communication connections may be wireless.

What is claimed is:

1. A lithographic apparatus, comprising:
    a first alignment arrangement comprising a first detector arranged to detect by a first alignment measurement a first alignment mark of a first type located on an object and to produce a first alignment signal;
    a second alignment arrangement comprising a second detector arranged to detect a second alignment mark of a second type, different from the first type, on the object and to produce a second alignment signal;
    a processor connected to the first detector and to the second detector, and configured to:
        receive the first alignment signal from the first detector;
        calculate a first position based on the first alignment signal;
        receive the second alignment signal from the second detector;
        calculate a second position based on the second alignment signal; and
        evaluate the first and second positions to select either the first or second alignment arrangement to perform further alignment measurements based on a quality indicator.

2. Lithographic apparatus according to claim 1, wherein the quality indicator is a signal strength, a noise level, and/or a fit quality of the first and second alignment signals.

3. Lithographic apparatus according to claim 1, wherein the first and second alignment arrangements are configured to perform laser step alignment measurement, laser interferometric alignment measurement, or field image alignment measurement.

4. Lithographic apparatus according to claim 1, wherein the lithographic apparatus is arranged to perform immersion lithography.

5. Lithographic apparatus according to claim 1, wherein the object is a substrate having a top side to be exposed by the lithographic apparatus and a bottom side, and the first and second alignment marks are located on the bottom side.

6. An alignment measurement method, comprising:
    detecting a first alignment mark of a first type located on an object and producing a first alignment signal by a first detector;
    detecting a second mark of a second type, different from the first type, on the object and producing a second alignment signal by a second detector;
    receiving the first alignment signal from the first detector;
    calculating a first position based on the first alignment signal;
    receiving the second alignment signal from the second detector;
    calculating a second position based on the second alignment signal; and
    evaluating the first and second positions to select either a first or a second alignment arrangement to perform further alignment measurements based on a quality indicator.

7. A method according to claim 6, wherein the object is a substrate and the method comprises after evaluating the first and second positions to select either the first or second alignment arrangement to perform further alignment measurements based on a quality indicator:
    projecting a patterned radiation beam onto a target portion of the object; and
    manufacturing a device from the object.

8. A computer program product comprising data and instructions embodied in a tangible medium to be loaded by a processor of a lithographic apparatus, and configured to instruct the lithographic apparatus to perform an alignment measurement method comprising;
    detecting a first alignment mark of a first type located on an object and producing a first alignment signal by a first detector;
    detecting a second mark of a second type, different from the first type, on the object and producing a second alignment signal by a second detector;
    receiving the first alignment signal from the first detector;
    calculating a first position based on the first alignment signal;
    receiving the second alignment signal from the second detector;
    calculating a second position based on the second alignment signal; and
    evaluating the first and second positions to select either a first or a second alignment arrangement to perform further alignment measurements based on a quality indicator.

9. A tangible data carrier comprising a computer program product as claimed in claim 8.

* * * * *